US009379709B2

(12) United States Patent
Nguyen

(10) Patent No.: US 9,379,709 B2
(45) Date of Patent: Jun. 28, 2016

(54) SIGNAL CONVERSION

(71) Applicant: FINISAR CORPORATION, Sunnyvale, CA (US)

(72) Inventor: The'Linh Nguyen, San Jose, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/738,472

(22) Filed: Jun. 12, 2015

(65) Prior Publication Data
US 2015/0381178 A1 Dec. 31, 2015

Related U.S. Application Data

(60) Provisional application No. 62/018,792, filed on Jun. 30, 2014.

(51) Int. Cl.
*H03K 19/0185* (2006.01)
*H03K 19/094* (2006.01)
*H03K 19/018* (2006.01)
*H03K 3/017* (2006.01)
*H03K 19/0175* (2006.01)

(52) U.S. Cl.
CPC .......... *H03K 19/01806* (2013.01); *H03K 3/017* (2013.01); *H03K 19/017509* (2013.01); *H03K 19/018514* (2013.01); *H03K 19/018528* (2013.01)

(58) Field of Classification Search
CPC .............. H03K 19/018528; H03K 19/018507; H03K 19/0013
USPC ................................................ 326/68, 80, 81
See application file for complete search history.

(56) References Cited

U.S. PATENT DOCUMENTS

| 5,153,465 | A | 10/1992 | Sandhu |
| 6,008,674 | A | 12/1999 | Wada et al. |
| 6,369,621 | B1 | 4/2002 | Tinsley et al. |
| 6,661,274 | B1 * | 12/2003 | Naka ................ H03K 3/356113 326/81 |
| 7,199,617 | B1 * | 4/2007 | Schrom .......... H03K 19/018528 326/68 |

FOREIGN PATENT DOCUMENTS

| EP | 0721254 A2 | 7/1996 |
| EP | 0785629 A | 7/1997 |

OTHER PUBLICATIONS

International Search Report and Written Opinion mailed Sep. 16, 2015 in related PCT Application No. PCT/US2015/038676 (16 pages).

* cited by examiner

*Primary Examiner* — Daniel D Chang
(74) *Attorney, Agent, or Firm* — Maschoff Brennan

(57) ABSTRACT

A circuit may include an input terminal configured to receive an input signal with a first voltage swing and an output terminal. The circuit may also include a first transistor, a second transistor, a third transistor, and a control circuit. The control circuit may be coupled to the input terminal, a gate terminal of the first transistor, and a gate terminal of the second transistor. The control circuit may be configured to adjust voltages provided to the gate terminals based on the input signal such that the first transistor conducts in response to the input signal being at a first logical level and the second transistor conducts in response to the input signal being at a second logical level to generate an output signal output on the output terminal. The second voltage swing of the output signal may be different from the first voltage swing of the input signal.

20 Claims, 7 Drawing Sheets

SIGNAL CONVERSION

CROSS-REFERENCE TO RELATED APPLICATION

This patent application claims priority to U.S. Provisional Patent Application Ser. No. 62/018,792, filed Jun. 30, 2014, which is incorporated herein by reference.

FIELD

The embodiments discussed herein are related to signal conversion.

BACKGROUND

Different signaling standards may be used in circuits to transmit data. The different signaling standards may include current-mode-logic (CML), complementary metal-oxide-semiconductor (CMOS), transistor-transistor logic (TTL), low voltage TTL (LVTTL), emitter-coupled logic (ECL), among others types of signaling standards. A signaling standard may be selected for a design based on circuitry, logic, and/or signaling speeds for the design. In some circumstances, a design may use two or more signaling standards. For example, the CML standard may be used to transmit data signals between modules in a design and the CMOS standard may be used when processing the data signals within the modules. In these circumstances, the data signals may be converted from the CML standard to the CMOS standard.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Some example embodiments generally relate to signal conversion.

In an example embodiment, a circuit may include an input terminal configured to receive an input signal with a first voltage swing and an output terminal configured to output an output signal with a second voltage swing that is different than the first voltage swing. The circuit may also include first, second, and third transistors, an amplifier, a first resistance, and a second resistance. The first transistor may include a first gate terminal and a first drain terminal. The first gate terminal may be coupled to the input terminal. The second transistor may include a second gate terminal, a second source terminal, and a second drain terminal. The second source terminal may be coupled to the first drain terminal. The amplifier may include first and second amplifier input terminals and an amplifier output terminal. The amplifier output terminal may be coupled to the second gate terminal. The second amplifier input terminal may be configured to receive a control voltage. The first resistance may be coupled between the second source terminal and the second amplifier input terminal. The third transistor may include a third gate terminal, a third source terminal, and a third drain terminal. The third source terminal may be coupled to a first voltage and the third drain terminal may be coupled to the output terminal. The second resistance may be coupled between the third gate terminal and the amplifier output terminal. The fourth transistor may include a fourth gate terminal, a fourth source terminal, and a fourth drain terminal. The fourth source terminal may be coupled to a second voltage, the fourth drain terminal may be coupled to the output terminal, and the fourth gate terminal may be coupled to the second drain terminal.

In yet another example embodiment, a circuit may include an input terminal configured to receive an input signal with a first voltage swing and an output terminal. The circuit may also include a first transistor, a second transistor, a third transistor, and a control circuit. The first transistor may include a first gate terminal, a first source terminal, and a first drain terminal. The second transistor may include a second gate terminal, a second source terminal, and a second drain terminal. The second drain terminal may be coupled to the output terminal and the second source terminal may be coupled to a first voltage. The third transistor may include a third gate terminal, a third source terminal, and a third drain terminal. The third drain terminal may be coupled to the output terminal, the third source terminal may be coupled to a second voltage, and the third gate terminal may be coupled to the first drain terminal. The control circuit may be coupled to the input terminal, the first gate terminal, and the second gate terminal. The control circuit may be configured to adjust voltages provided to the first gate terminal and the second gate terminal based on the input signal such that the second transistor conducts in response to the input signal being at a first logical level and the third transistor conducts in response to the input signal being at a second logical level to generate an output signal output on the output terminal. As a result, the second voltage swing of the output signal may be different from the first voltage swing of the input signal.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

Figure 1A:
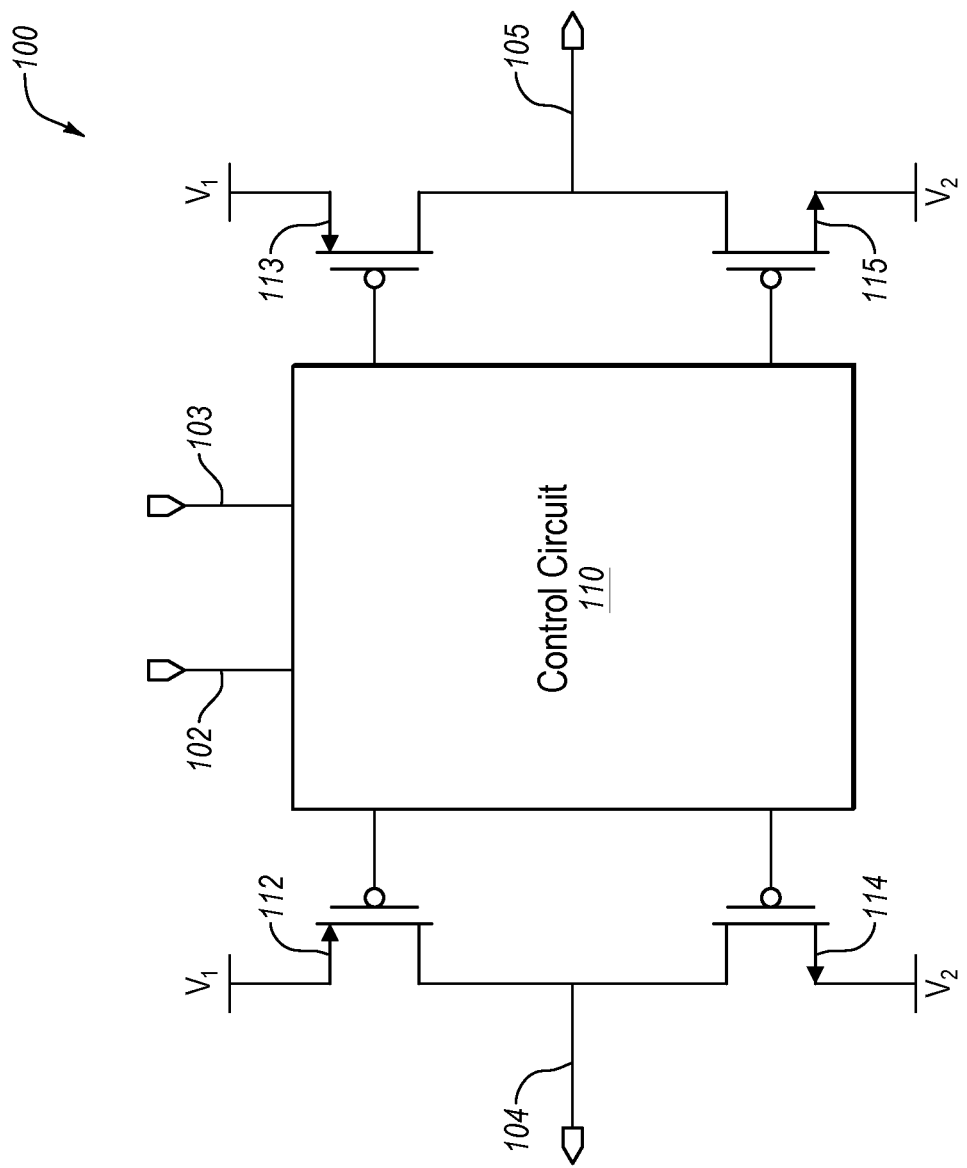
FIG. 1A illustrates an example signal conversion circuit.

FIG. 1A illustrates an example signal conversion circuit 100 ("the circuit 100"), arranged in accordance with at least some embodiments described herein. In general, the circuit 100 may be configured to receive a first differential signal and convert the first differential signal to a second differential signal. The second differential signal may include a voltage swing that is different from a voltage swing of the first differential signal. In particular, the voltage swing of the second differential signal may be greater than the voltage swing of the first differential signal. In these and other embodiments, a voltage swing of the differential signal may refer to a difference between a voltage that represents a logical low value of data carried by the differential signal and a voltage that presents a logical high value of data carried by the differential signal.

Figure 1B:
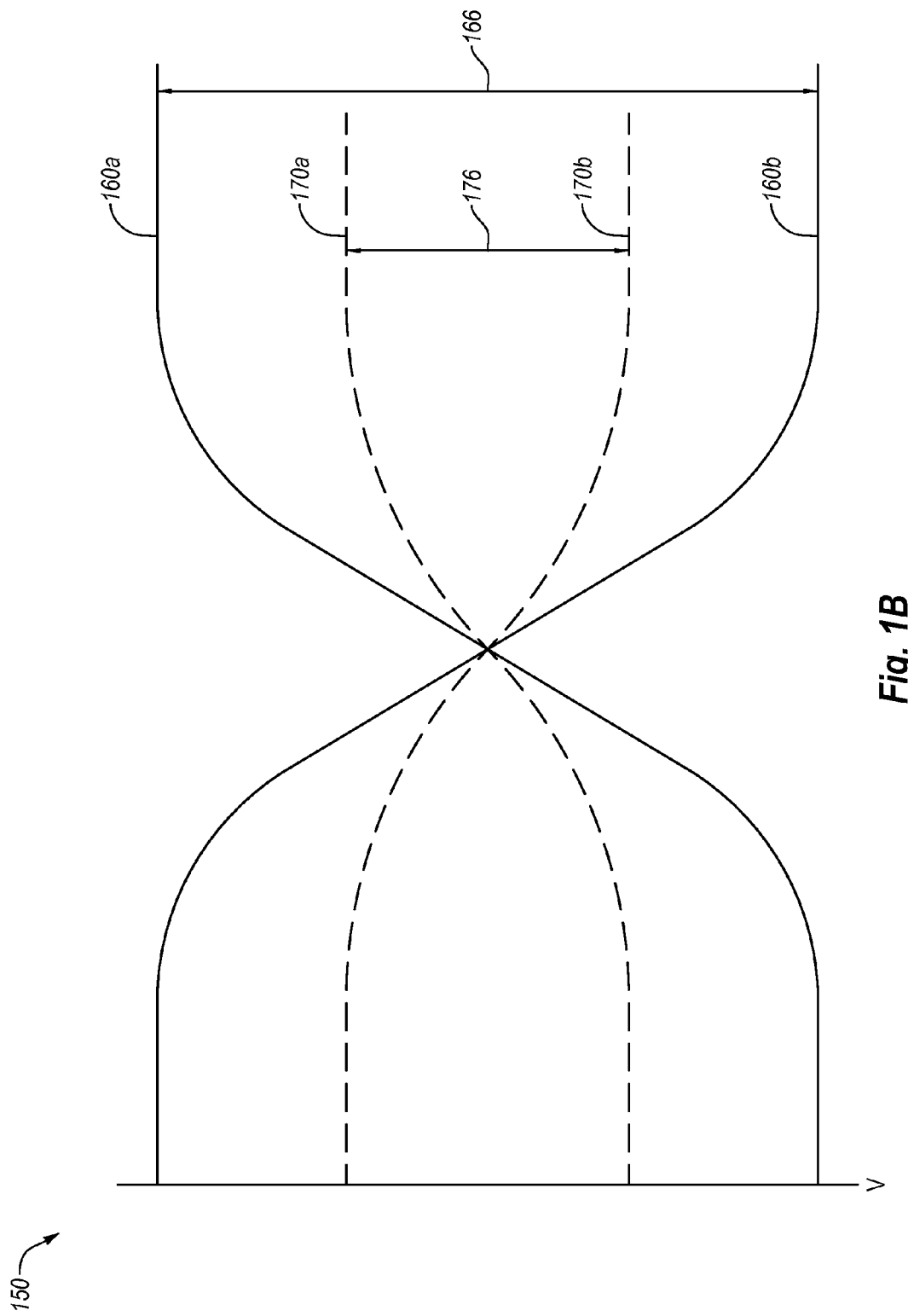
FIG. 1B illustrates a graph with two differential signals.

FIG. 1B illustrates a graph 150 with a first differential signal 160 and a second differential signal 170 and their respective voltage swings, arranged in accordance with at least some embodiments described herein. The first differential signal 160 may include a first signal 160a and a second signal 160b. The second differential signal 170 may include a first signal 170a and a second signal 170b. The graph 150 may further illustrate a first voltage swing 166 of the first differential signal 160 and a second voltage swing 176 of the second differential signal 170. As illustrated, the first voltage swing 166 may be larger than the second voltage swing 176.

Referring again to FIG. 1A, the circuit 100 may include first and second input terminals 102 and 103, first and second output terminals 104 and 105, a control circuit 110, and first, second, third, and fourth transistors 112-115. Each of the transistors may include a gate terminal, a source terminal, and a drain terminal. As illustrated in FIG. 1, the source terminal may be the terminal with the arrow, the gate terminal may be the terminal with the parallel horizontal lines, and the drain terminal may be the other terminal.

The first and second input terminals 102 and 103 may be coupled to the control circuit 110. The control circuit 110 may be coupled to the gate terminals of each of the first, second, third, and fourth transistors 112-115. Source terminals of each of the first and second transistors 112 and 113 may be coupled to a first voltage V1. Source terminals of each of the third and fourth transistors 114 and 115 may be coupled to a second voltage V2. Drain terminals of the first transistor 112 and the third transistor 114 may be coupled to the first output terminal 104. Drain terminals of the second transistor 113 and the fourth transistor 115 may be coupled to the second output terminal 105.

The first and second input terminals 102 and 103 may be configured to provide an input differential signal to the control circuit 110. The control circuit 110 may be configured to adjust the voltages on the gate terminals of each of the first, second, third, and fourth transistors 112-115 based on the received input differential signal to generate an output differential signal on the first and second output terminals 104 and 105. The voltage swing of the output differential signal may be between the first voltage V1 and the second voltage V2. In these and other embodiments, the voltage swing of the output differential signal may be larger than a voltage signal of the input differential signal. In some embodiments, the voltage swing of the output differential signal may include a middle value that is equal or approximately equal to a middle value of the voltage swing of the input differential signal. Alternately or additionally, the middle value of the voltage swing of the output differential signal may be offset from the middle value of the voltage swing of the input differential signal. In these and other embodiments, the voltage swing of the output differential signal may be between the first voltage and the second voltage. In some embodiments, the second voltage may be at ground potential, e.g., approximately zero volts or zero volts. When discussing voltage swings of the output differential signal, a value that is approximately zero, in some embodiments, may be a value that is within a range between −0.4 and 0.4.

An example of the circuit 100 generating the output differential signal follows. A first input signal of the input differential signal may be a logical high and a second input signal of the input differential signal may be a logical low. The circuit 100 may generate a first output signal of the output differential signal on the first output terminal 104 that is a logical high and may generate a second output signal of the output differential signal on the second output terminal 105 that is a logical low.

To generate the first output signal, the control circuit 110 may set a gate voltage at the gate terminal of the third transistor 114 such that the third transistor 114 does not conduct and may set a gate voltage at the gate terminal of the first transistor 112 such that the first transistor 112 conducts. As a result, the first output terminal 104 may be pulled to the first voltage V1, which may represent a logical high for the first output signal.

As used herein, the phrase "gate voltage" may refer to a voltage at a gate of a transistor. The phrase "source voltage" may refer to a voltage at a source of a transistor and the phrase "drain voltage" may refer to a voltage at a drain of a transistor.

Furthermore, as used herein, the term "conduct" with respect to a transistor indicates that the transistor is in a non-cut-off region of operation, such as the linear or saturation region of operation, such that current flows between a source and a drain of the transistor. Thus, when a transistor is described as conducting or that it conducts, the transistor is in a non-cut-off region of operation. In contrast, when a transistor is described as not conducting or that it does not conduct, the transistor is in a cut-off region of operation such that high impedance is presented at a drain and a source of the transistor.

To generate the second output signal, the control circuit 110 may set a gate voltage of the second transistor 113 such that the second transistor 113 does not conduct and may set a gate voltage of the fourth transistor 115 such that the fourth transistor 115 conducts. As a result, the second output terminal 105 may be pulled to the second voltage V2, which may represent a logical low for the first output signal. In this manner, the circuit 100 may generate the output differential signal that includes a voltage swing between the first and second voltages V1 and V2 that is larger than a voltage swing of the input differential signal. As an example, the input differential signal may be a current-mode-logic (CML) signal and the output differential signal may be a complementary metal-oxide-semiconductor (CMOS) signal.

Modifications, additions, or omissions may be made to the circuit 100 without departing from the scope of the present disclosure. For example, additional active or passive circuit elements may be included in the circuit 100.

Figure 2A:
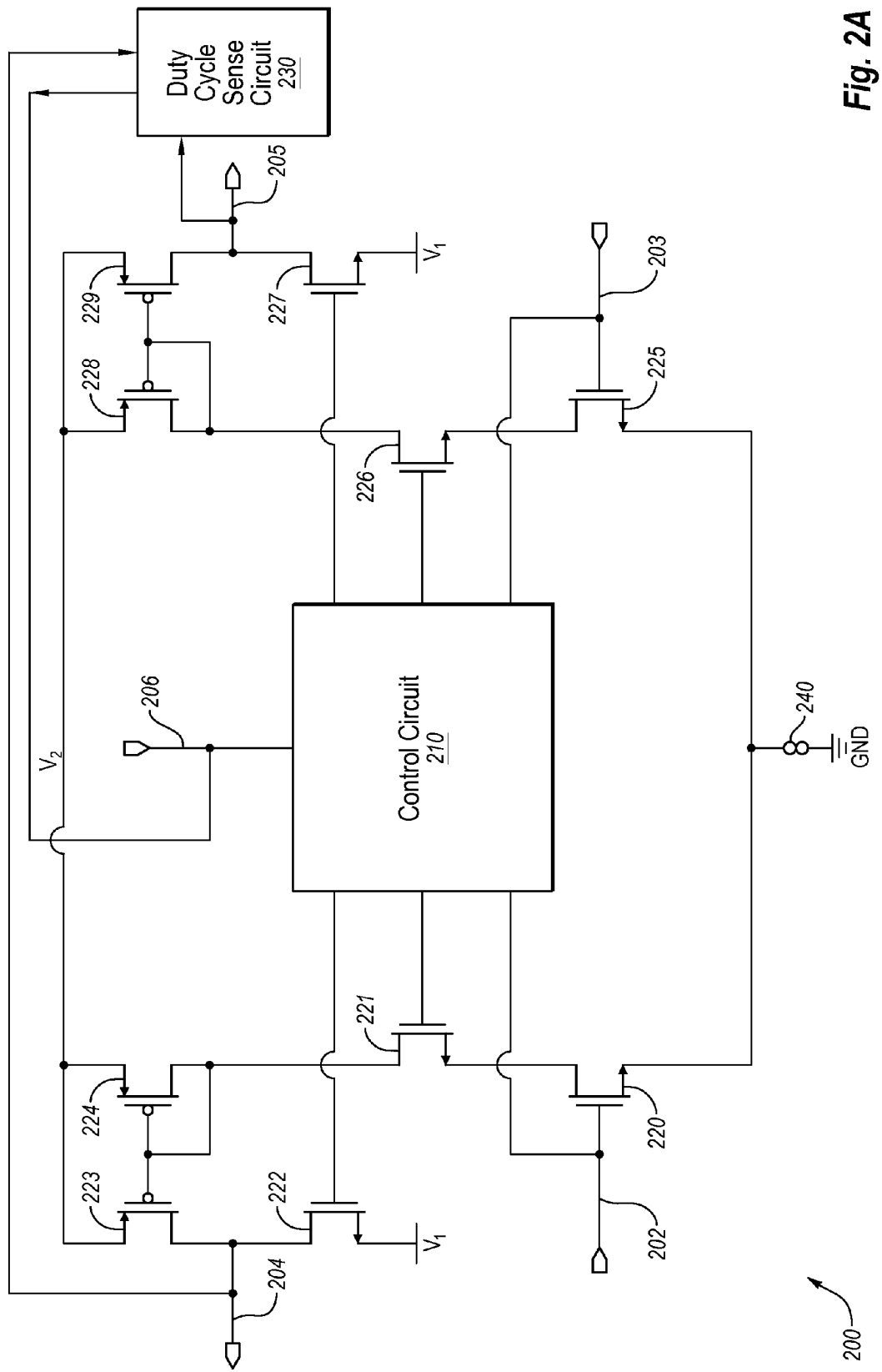
FIG. 2A illustrates another example signal conversion circuit.

FIG. 2A illustrates another example signal conversion circuit 200 ("the circuit 200"), arranged in accordance with at least some embodiments described herein. In general, the circuit 200 may be configured to receive an input differential signal and convert the input differential signal to an output differential signal. The output differential signal may include a voltage swing that is different from a voltage swing of the input differential signal. In particular, the voltage swing of the output differential signal may be between a first voltage V1 and a second voltage V2 and may be greater than the voltage swing of the input differential signal. In these and other embodiments, both the first voltage and the second voltage may be non-ground potential voltages. In some embodiments, both the first and second voltages may be lower than the lowest voltage of the input differential signal or may be higher than the highest voltage of the input differential signal. Alternately or additionally, one of the first and second voltages may be within the voltage swing of the input differential signal.

The circuit 200 may include first and second input terminals 202 and 203, first and second output terminals 204 and 205, a control voltage terminal 206, a control circuit 210, first, second, third, fourth, fifth, sixth, seventh, eighth, ninth, and tenth transistors 220-229, referred to herein collectively as the transistors 220-229, a duty cycle sense circuit 230, and a first current source 240.

Each of the transistors 220-229 may include a gate terminal, a source terminal, and a drain terminal. As illustrated in FIG. 2A, the source terminal may be the terminal with the arrow, the gate terminal may be the terminal with the parallel horizontal lines, and the drain terminal may be the other terminal. As illustrated in FIG. 2A, the first, second, third, sixth, seventh, and eighth transistors 220, 221, 222, 225, 226, and 227 may include n-type transistors. The fourth, fifth, ninth, and tenth transistors 223, 224, 228, and 229 may include p-type transistors.

A gate terminal of the first transistor 220 may be coupled to the first input terminal 202. A source terminal of the first transistor 220 may be coupled to the first current source 240. A drain terminal of the first transistor 220 may be coupled to a source terminal of the second transistor 221.

A gate terminal of the second transistor 221 may be coupled to the control circuit 210. A drain terminal of the second transistor 221 may be coupled to a drain terminal of the fifth transistor 224, a gate of the fifth transistor 224, and to a gate of the fourth transistor 223. Source terminals of the fourth and fifth transistors 223 and 224 may be coupled to the second voltage V2. A drain terminal of the fourth transistor 223 may be coupled to the first output terminal 204 and to a drain terminal of the third transistor 222. A gate terminal of the third transistor 222 may be coupled to the control circuit 210. A source terminal of the third transistor 222 may be coupled to the first voltage V1. The first voltage V1 may be lower than the second voltage V2.

A gate terminal of the sixth transistor 225 may be coupled to the second input terminal 203. A source terminal of the sixth transistor 225 may be coupled to the first current source 240. A drain terminal of the sixth transistor 225 may be coupled to a source terminal of the seventh transistor 226.

A gate terminal of the seventh transistor 226 may be coupled to the control circuit 210. A drain terminal of the seventh transistor 226 may be coupled to a drain terminal of the ninth transistor 228, a gate of the ninth transistor 228, and to a gate of the tenth transistor 229. Source terminals of the ninth and tenth transistors 228 and 229 may be coupled to the second voltage V2. A drain terminal of the tenth transistor 229 may be coupled to the second output terminal 205 and to a drain terminal of the eighth transistor 227. A gate terminal of the eighth transistor 227 may be coupled to the control circuit 210. A source terminal of the eighth transistor 227 may be coupled to the first voltage V1.

The control circuit 210 may be coupled to the first and second input terminals 202 and 203 and to the control voltage terminal 206. The duty cycle sense circuit 230 may be coupled to the control voltage terminal 206 and the first and second output terminals 204 and 205.

The control circuit 210 may be configured to control gate voltages of the third and eighth transistors 222 and 227 to control whether the third and eighth transistors 222 and 227 conduct or do not conduct. The control circuit 210 may also be configured to control the gate voltages of the second and seventh transistors 221 and 226 to control whether the second and seventh transistors 221 and 226 conduct or do not conduct. By controlling when the second, third, seventh, and eighth transistors 221, 222, 226, and 227 conduct, the control circuit 210 may control the generation of the output differential signal that is output on the first and second output terminals 204 and 205.

In particular, the control circuit 210 may be configured to adjust the gate voltages of the second, third, seventh, and eighth transistors 221, 222, 226, and 227 based on the input differential signal to control the generation of the output differential signal. For example, the input differential signal may include first and second input signals. The control circuit 210 may adjust the gate voltages of the second and third transistors 221 and 222 based on a logical level of the first input signal to generate a first output signal of the output differential signal that is output on the first output terminal 204. The control circuit 210 may also adjust the gate voltages of the seventh and eighth transistors 226 and 227 based on a logical level of the second input signal to generate a second output signal of the output differential signal that is output on the second output terminal 205.

In these and other embodiments, the control circuit 210 may adjust the gate voltages of the second, third, seventh, and eighth transistors 221, 222, 226, and 227 based on the input differential signal such that the output differential signal includes a signal pattern that corresponds to a signal pattern of the input differential signal. In these and other embodiments, a corresponding signal pattern may indicate that the output differential signal includes logical highs and logical lows that match or are an inverse of the logical highs and logical lows of the input differential signal.

An example of the operation of the circuit 200 follows based on the first input signal being a logical high and the second input signal being a logical low. The first input signal may be received by the control circuit 210. When the first input signal is a logical high, the control circuit 210 may adjust the gate voltage of the third transistor 222 such that the third transistor 222 does not conduct and provides a high impedance at its drain terminal coupled to the first output terminal 204. The control circuit 210 may also adjust the gate voltage of the second transistor 221 such that the second transistor 221 conducts. The logical high at the gate terminal of the first transistor 220 may also cause the first transistor 220 to conduct. The fifth transistor 224 with its gate terminal coupled to its drain terminal and with the first and second transistors 220 and 221 conducting may also conduct such that current flows from the second voltage V2 through the first current source 240 to ground. The fourth transistor 223 may be in a current mirror configuration with the fifth transistor 224. As a result, when the fifth transistor 224 conducts, the fourth transistor 223 may also conduct. As the fourth transistor 223 conducts current from its source terminal to its drain terminal, the current may build at the first output terminal 204, raising the voltage at the first output terminal 204 to the second voltage V2 such that the first output signal is output as a logical high.

When the second input signal is a logical low, the control circuit 210 may adjust the gate voltage of the seventh transistor 226 such that the seventh transistor 226 does not conduct. Furthermore, the logical low at the gate terminal of the sixth transistor 225 may cause the sixth transistor 225 to not conduct. As a result, the ninth transistor 228 does not conduct. The tenth transistor 229 may be in a current mirror configuration with the ninth transistor 228 and thus does not conduct. As a result, the tenth transistor 229 may provide a high impedance at its drain terminal coupled to the second output terminal 205.

Furthermore, when the second input signal is a logical low, the control circuit 210 may adjust the gate voltage of the seventh transistor 226 such that the seventh transistor 226 conducts. As the seventh transistor 226 conducts current from its source terminal to its drain terminal, the current may build at the second output terminal 205, dropping or raising the voltage at the second output terminal 205 to the first voltage V1. Thus, the second output signal may be output as a logical low and the voltage swing of the output differential signal may be the difference between the first and second voltages V1 and V2. In response to the first input signal switching to a logical low and the second input signal switching to a logical high, the control circuit 210 may be configured to adjust the gate voltages such that the first output signal is a logical low and the second output signal is a logical high in a similar manner as described above.

The duty cycle sense circuit 230 may be coupled to the first and second output terminals 204 and 205 and may be configured to receive the output differential signal. The duty cycle sense circuit 230 may be configured to detect a duty cycle of the output differential signal. A duty cycle may relate to an amount of time that the output differential signal is at a logical high level with respect to an amount of time that the output differential signal is at a logical low level. The duty cycle sense circuit 230 may compare the detected duty cycle to a particular duty cycle. In response to the detected duty cycle being different from the particular duty cycle, the duty cycle sense circuit 230 may determine how to correct the duty cycle of the output differential signal. The detected duty cycle may be different from the particular duty cycle due to process variations when manufacturing the transistors 220-229, circuit variations such as temperature, voltage levels, electromagnetic interface, among others. The duty cycle sense circuit 230 may send an indication of the correction to the control circuit 210.

The control circuit 210 may receive the indication of the correction. Based on the indication, the control circuit 210 may adjust when one or more of the second, third, seventh, and eighth transistors 221, 222, 226, and 227 conducts in response to the input differential signal to adjust the duty cycle of the output differential signal. For example, the control circuit 210 may delay adjusting the gate voltages of the second, third, seventh, and eighth transistors 221, 222, 226, and 227 in response to the input differential signal to adjust the duty cycle of the output differential signal with respect to the input differential signal.

Modifications, additions, or omissions may be made to the circuit 200 without departing from the scope of the present disclosure. For example, additional active or passive circuit elements may be included in the circuit 200. Alternately or additionally, the circuit 200 may not include the duty cycle sense circuit 230. In these and other embodiments, the circuit 200 may not include the control voltage terminal 206.

Figure 2B:
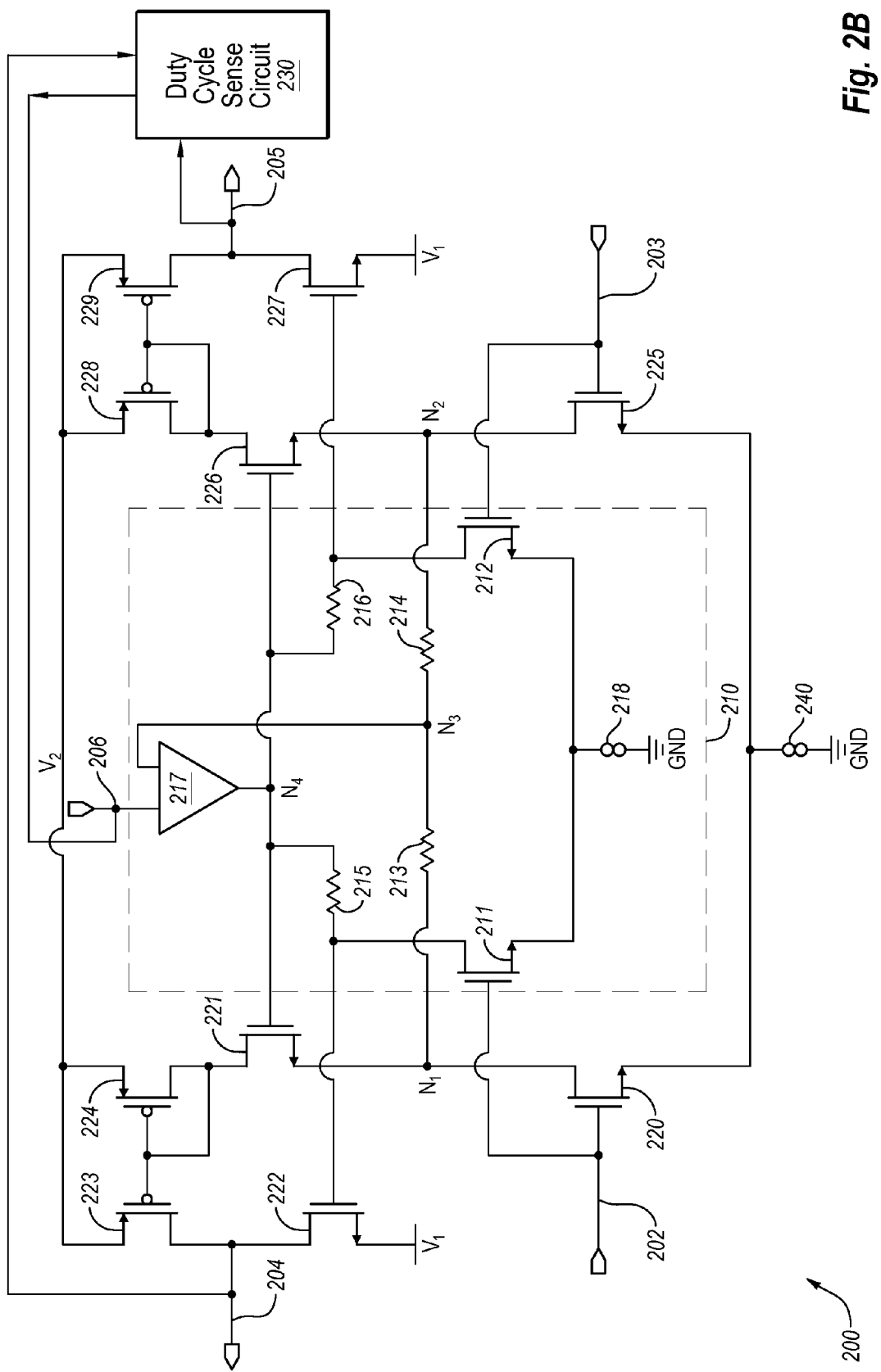
FIG. 2B illustrates an example implementation of a control circuit in the signal conversion circuit of FIG. 2A.

FIG. 2B illustrates an example implementation of the control circuit 210 of the signal conversion circuit 200 of FIG. 2A, arranged in accordance with at least some embodiments described herein. The control circuit 210 may include a first control transistor 211, a second control transistor 212, a first resistance 213, a second resistance 214, a third resistance 215, a fourth resistance 216, a differential amplifier 217, and a second current source 218.

Each of the control transistors 211 and 212 may include a gate terminal, a source terminal, and a drain terminal. As illustrated in FIG. 2B, the source terminal may be the terminal with the arrow, the gate terminal may be the terminal with the parallel horizontal lines, and the drain terminal may be the other terminal. As illustrated in FIG. 2B, the control transistors 211 and 212 may be n-type transistors.

A gate terminal of the first control transistor 211 may be coupled to the first input terminal 202. A source terminal of the first control transistor 211 may be coupled to the second current source 218. The drain terminal of the first control transistor 211 may be coupled to the gate terminal of the third transistor 222 and to a first end of the third resistance 215. A second end of the third resistance 215 may be coupled to a fourth node N4 to which the gate terminals of the second and seventh transistors 221 and 226 and an output terminal of the differential amplifier 217 are also coupled.

A gate terminal of the second control transistor 212 may be coupled to the second input terminal 203. A source terminal of the second control transistor 212 may be coupled to the second current source 218. The drain terminal of the second control transistor 212 may be coupled to the gate terminal of the eighth transistor 227 and to a first end of the fourth resistance 216. The second end of the fourth resistance 216 may be coupled to the fourth node N4.

A first end of the first resistance 213 may be coupled to the drain terminal of the first transistor 220 and the source terminal of the second transistor 221 at a first node N1. The second end of the first resistance 213 may be coupled to a second end of the second resistance 214 and to a first input terminal of the differential amplifier 217 at a third node N3. The first end of the second resistance 214 may be coupled to the drain terminal of the sixth transistor 225 and the source terminal of the seventh transistor 226 at a second node N2. A second input terminal of the differential amplifier 217 may be coupled to the control voltage terminal 206.

In general, the differential amplifier 217 is configured to operate to maintain the voltage at the third node N3 equal or approximately equal to a control voltage on the control voltage terminal 206. As illustrated, the third node N3 is a common voltage node with respect to the first and second nodes N1 and N2 because the second input terminal of the differential amplifier 217 includes a high input impedance. As a result, the voltage at the third node N3 when the resistances of the first and second resistances 213 and 214 are approximately equal is an average of the voltages on the first and second nodes N1 and N2. Thus, to maintain the third node N3 at a particular voltage, such as the control voltage on the control voltage terminal 206, the amplifier 217 may set a particular voltage at N4 even if the voltage on one of the first and second nodes N1 and N2 may increase and the voltage on another of the first and second nodes N1 and N2 may decrease.

The control circuit 210 may be configured to control the gate voltages of the third and eighth transistors 222 and 227 to control whether the third and eighth transistors 222 and 227 conduct or do not conduct using the first and second control transistors 211 and 212. For example, with the voltage at the fourth node N4 relatively stable, the gate voltage of the third transistor 222 may be controlled using the first control transistor 211. When the first control transistor 211 conducts, a current may pass through the third resistance 215. The current passing through the third resistance 215 may result in a voltage drop across the third resistance 215. As a result, the gate voltage of the third transistor 222 is the voltage on the fourth node N4 minus the voltage drop across the third resistance 215. The current through the third resistance 215 may be controlled by the second current source 218. Thus, by selecting appropriate values for the current of the second current source 218 and the third resistance 215, when the first control transistor 211 conducts the voltage drop across the third resistance 215 may be sufficient such that the gate voltage of the third transistor 222 is such that the third transistor 222 does not conduct. In the alternative, when the first control transistor 211 does not conduct, there may not be a voltage drop across the third resistance 215 and the gate voltage of the third transistor 222 may be the voltage on the fourth node N4. The voltage on the fourth node N4 may be sufficient to cause the third transistor 222 to conduct. The control circuit 210 may be configured to control the gate voltage of the eighth transistor 227 using the second control transistor 212 and the fourth resistance 216 in a similar manner as discussed above with respect to the third transistor 222.

An example of the operation of the circuit 200 using the illustrated implementation of the control circuit 210 follows based on the first input signal being a logical high and the second input signal being a logical low. In response to the first input signal being a logical high, the gate voltage of the first transistor 220 may be high enough to cause the first transistor 220 to conduct. As the first transistor 220 conducts, it may reduce the voltage at the first node N1 such that the second transistor 221 conducts. When the second transistor 221 conducts, it may reduce the gate voltages of the fourth and fifth transistors 223 and 224 such that the fourth and fifth transistors 223 and 224 conduct. Also, in response to the first input signal being a logical high, the gate voltage of the first control transistor 211 may be high enough to cause the first control transistor 211 to conduct. As a result, current may pass through the third resistance 215 resulting in the gate voltage of the third transistor 222 being reduced and the third transistor 222 not conducting. Thus, the first output terminal 204 may be raised to the second voltage V2.

In response to the second input signal being a logical low, the gate voltage of the first transistor 220 may be such that the sixth transistor 225 does not conduct. Additionally, due to the reduction of the voltage of the first node N1, the voltage at the second node N2 may raise to maintain the voltage at node N3 approximately equal to the control voltage on the control voltage terminal 206. As a result, the seventh transistor 226 may not conduct. When the seventh transistor 226 does not conduct, the gate voltage of the ninth and tenth transistors 228 and 229 are such that the ninth and tenth transistors 228 and 229 do not conduct.

Also, in response to the second input signal being a logical low, the gate voltage of the first control transistor 211 may be such that the first control transistor 211 does not conduct. As a result, no current passes through the third resistance 215 resulting in the gate voltage of the eighth transistor 227 being equal or approximately equal to the voltage of the fourth node N4 and the eighth transistor 227 conducting. Thus, the second output terminal 205 may be lowered to the first voltage V1. In response to the first input signal switching to a logical low and the second input signal switching to a logical high, the control circuit 210 may be configured to adjust the gate voltages such that the first output signal is a logical low and the second output signal is a logical high in a similar manner as described above.

Modifications, additions, or omissions may be made to the circuit 200 without departing from the scope of the present disclosure. For example, additional active or passive circuit elements may be included in the circuit 200.

Figure 3A:
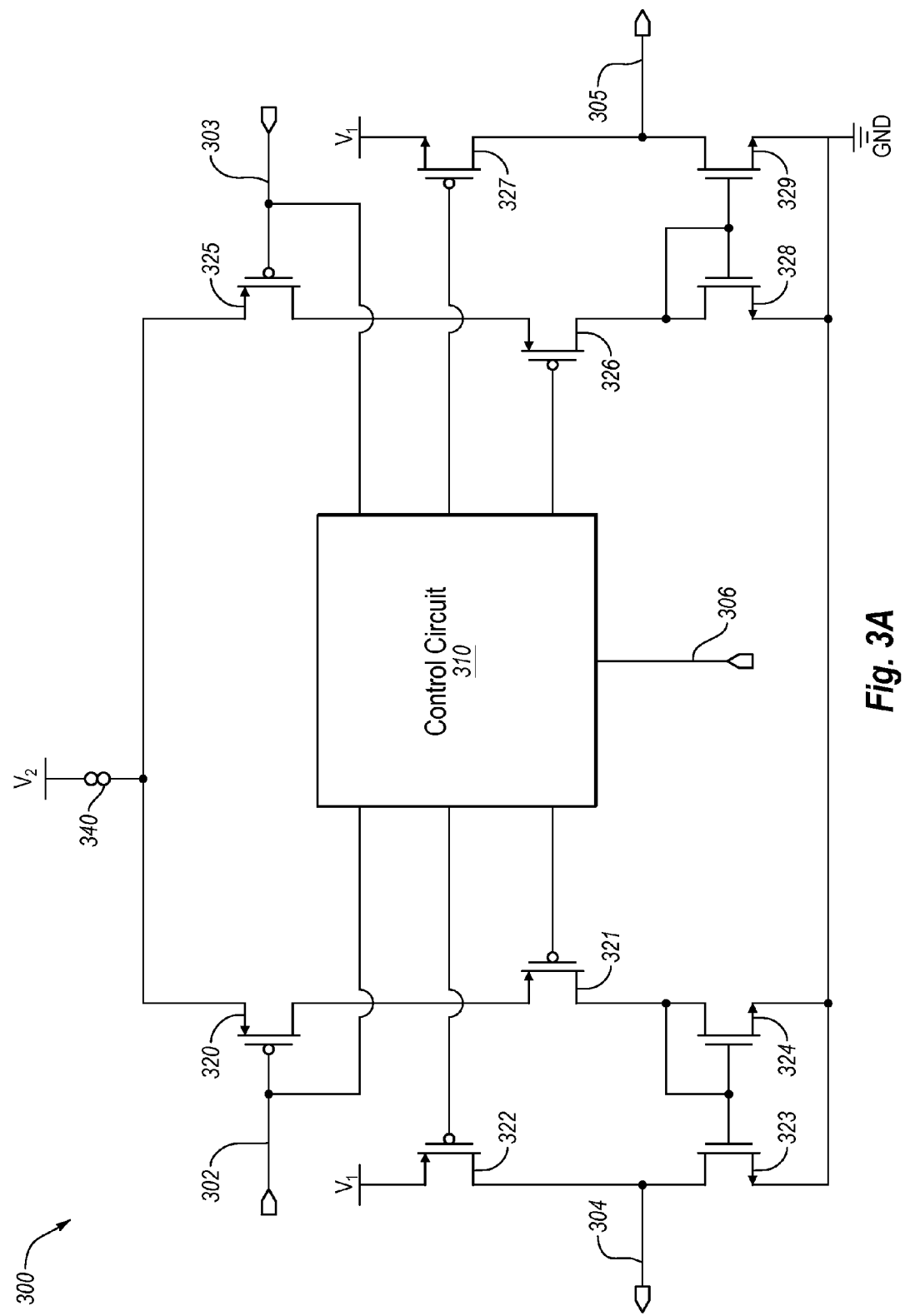
FIG. 3A illustrates another example signal conversion circuit.

FIG. 3A illustrates another example signal conversion circuit 300 ("the circuit 300"), arranged in accordance with at least some embodiments described herein. In general, the circuit 300 may be configured to receive an input differential signal and convert the input differential signal to an output differential signal. The output differential signal may include a voltage swing that is different from a voltage swing of the input differential signal. In particular, the voltage swing of the output differential signal may be between a ground potential and a first voltage and may be greater than the voltage swing of the input differential signal.

The circuit 300 may include first and second input terminals 302 and 303, first and second output terminals 304 and 305, a control voltage terminal 306, a control circuit 310, first, second, third, fourth, fifth, sixth, seventh, eighth, ninth, and tenth transistors 320-329, referred to herein collectively as the transistors 320-329, and a first current source 340.

Each of the transistors 320-329 may include a gate terminal, a source terminal, and a drain terminal. As illustrated in FIG. 3A, the source terminal may be the terminal with the arrow, the gate terminal may be the terminal with the parallel horizontal lines, and the drain terminal may be the other terminal. As illustrated in FIG. 3A, the first, second, third, sixth, seventh, and eighth transistors 320, 321, 322, 325, 326, and 327 may include p-type transistors. The fourth, fifth, ninth, and tenth transistors 323, 324, 328, and 329 may include n-type transistors.

A gate terminal of the first transistor 320 may be coupled to the first input terminal 302. A source terminal of the first transistor 320 may be coupled to the first current source 340. A drain terminal of the first transistor 320 may be coupled to a source terminal of the second transistor 321.

A gate terminal of the second transistor 321 may be coupled to the control circuit 310. A drain terminal of the second transistor 321 may be coupled to a drain terminal of the fifth transistor 324, a gate of the fifth transistor 324, and to a gate of the fourth transistor 323. Source terminals of the fourth and fifth transistors 323 and 324 may be coupled to ground. A drain terminal of the fourth transistor 323 may be coupled to the first output terminal 304 and to a drain terminal of the third transistor 322. A gate terminal of the third transistor 322 may be coupled to the control circuit 310. A source terminal of the third transistor 322 may be coupled to the first voltage V1. The first voltage V1 may be higher than ground and lower than a second voltage V2 coupled to the first current source 340.

A gate terminal of the sixth transistor 325 may be coupled to the second input terminal 303. A source terminal of the sixth transistor 325 may be coupled to the first current source 340. A drain terminal of the sixth transistor 325 may be coupled to a source terminal of the seventh transistor 326.

A gate terminal of the seventh transistor 326 may be coupled to the control circuit 310. A drain terminal of the seventh transistor 326 may be coupled to a drain terminal of the ninth transistor 328, a gate of the ninth transistor 328, and to a gate of the tenth transistor 329. Source terminals of the ninth and tenth transistors 328 and 329 may be coupled to ground. A drain terminal of the tenth transistor 329 may be coupled to the second output terminal 305 and to a drain terminal of the eighth transistor 327. A gate terminal of the eighth transistor 327 may be coupled to the control circuit 310. A source terminal of the eighth transistor 327 may be coupled to the first voltage V1.

The control circuit 310 may be coupled to the first and second input terminals 302 and 303 and to the control voltage terminal 306. The control circuit 310 may be configured to control gate voltages of the third and eighth transistors 322 and 327 to control whether the third and eighth transistors 322 and 327 conduct or do not conduct. The control circuit 310 may also be configured to control the gate voltages of the second and seventh transistors 321 and 326 to control whether the second and seventh transistors 321 and 326 conduct or do not conduct. By controlling when the second, third, seventh, and eighth transistors 321, 322, 326, and 327 conduct, the control circuit 310 may control the generation of the output differential signal that is output on the first and second output terminals 304 and 305.

In particular, the control circuit 310 may be configured to adjust the gate voltages of the second, third, seventh, and eighth transistors 321, 322, 326, and 327 based on the input differential signal to control the generation of the output differential signal. For example, the input differential signal may include first and second input signals. The control circuit 310 may adjust the gate voltages of the second and third transistors 321 and 322 based on a logical level of the first input signal to generate a first output signal of the output differential signal that is output on the first output terminal 304. The control circuit 310 may also adjust the gate voltages of the seventh and eighth transistors 326 and 327 based on a logical level of the second input signal to generate a second output signal of the output differential signal that is output on the second output terminal 305.

In these and other embodiments, the control circuit 310 may adjust the gate voltages of the second, third, seventh, and eighth transistors 321, 322, 326, and 327 based on the input differential signal such that the output differential signal includes a signal pattern that corresponds to a signal pattern of the input differential signal. In these and other embodiments, a corresponding signal pattern may indicate that the output differential signal includes logical highs and logical lows that match or are an inverse of the logical highs and logical lows of the input differential signal.

An example of the operation of the circuit 300 follows based on the first input signal being a logical high and the second input signal being a logical low. The first input signal may be received by the control circuit 310. When the first input signal is a logical high, the control circuit 310 may adjust the gate voltage of the third transistor 322 such that the third transistor 322 may conduct current from its source terminal to its drain terminal, raising the voltage at the first output terminal 304 to first voltage V1. The control circuit 310 may also adjust the gate voltage of the second transistor 321 such that the second transistor 321 does not conduct. The logical high at the gate terminal of the first transistor 320 may also cause the first transistor 320 to not conduct. The fifth transistor 324 with its gate terminal coupled to its drain terminal and with the first and second transistors 320 and 321 not conducting may also not conduct such that no current flows from the second voltage V2 through the first current source 340 to ground through the first, second, and fifth transistors 320, 321, and 324. The fourth transistor 323 may be in a current mirror configuration with the fifth transistor 324. As a result, when the fifth transistor 324 does not conduct, the fourth transistor 323 may also not conduct. When the fourth transistor 323 does not conduct, it may provide a high impedance at its drain terminal coupled to the first output terminal 304.

When the second input signal is a logical low, the control circuit 310 may adjust the gate voltage of the seventh transistor 326 such that the seventh transistor 326 conducts. Furthermore, the logical low at the gate terminal of the sixth transistor 325 may cause the sixth transistor 325 to conduct. As a result, the ninth transistor 328 conducts. The tenth transistor 329 may be in a current mirror configuration with the ninth transistor 328 and thus may conduct. As a result, the voltage at the second output terminal 305 may drop to ground.

Furthermore, when the second input signal is a logical low, the control circuit 310 may adjust the gate voltage of the seventh transistor 326 such that the seventh transistor 326 does not conduct. Thus, the second output signal may be output as a logical low and the voltage swing of the output differential signal may be the difference between the first voltage V1 and ground. In response to the first input signal switching to a logical low and the second input signal switching to a logical high, the control circuit 310 may be configured to adjust the gate voltages such that the first output signal is a logical low and the second output signal is a logical high in a similar manner as described above.

Modifications, additions, or omissions may be made to the circuit 300 without departing from the scope of the present disclosure. For example, additional active or passive circuit elements may be included in the circuit 300. Alternately or additionally, the circuit 300 may include a duty cycle sense circuit that may operate in a similar manner as the duty cycle sense circuit 230 of FIGS. 2A and 2B.

Figure 3B:
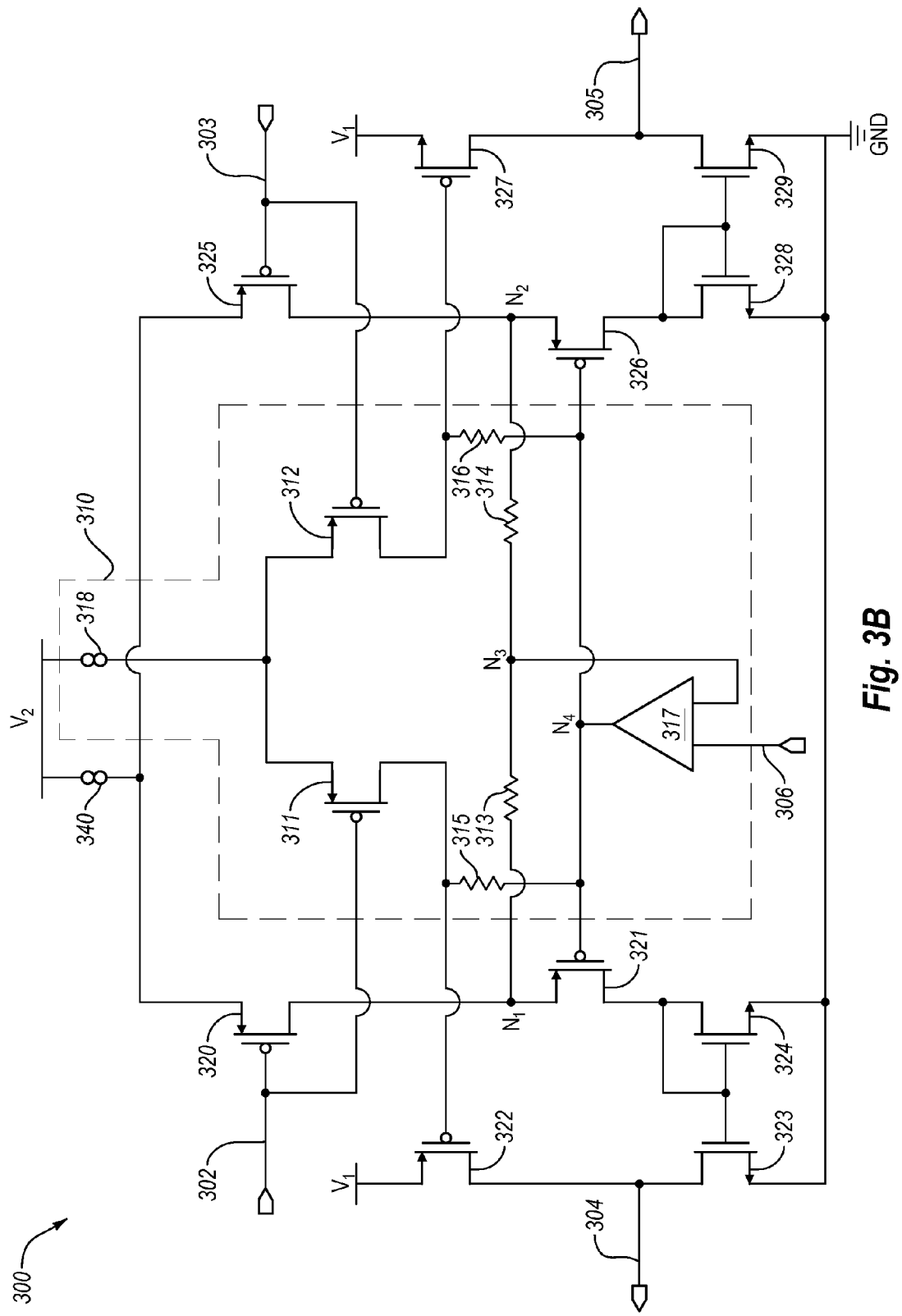
FIG. 3B illustrates an example implementation of a control circuit in the signal conversion circuit of FIG. 3A.

FIG. 3B illustrates an example implementation of the control circuit 310 of the signal conversion circuit 300 of FIG. 3A, arranged in accordance with at least some embodiments described herein. The control circuit 310 may include a first control transistor 311, a second control transistor 312, a first resistance 313, a second resistance 314, a third resistance 315, a fourth resistance 316, a differential amplifier 317, and a second current source 318.

Each of the control transistors 311 and 312 may include a gate terminal, a source terminal, and a drain terminal. As illustrated in FIG. 3B, the source terminal may be the terminal with the arrow, the gate terminal may be the terminal with the parallel horizontal lines, and the drain terminal may be the other terminal. As illustrated in FIG. 3B, the control transistors 311 and 312 may be p-type transistors.

A gate terminal of the first control transistor 311 may be coupled to the first input terminal 302. A source terminal of the first control transistor 311 may be coupled to the second current source 318. The drain terminal of the first control transistor 311 may be coupled to the gate terminal of the third transistor 322 and to a first end of the third resistance 315. A second end of the third resistance 315 may be coupled to a fourth node N4 to which the gate terminals of the second and sixth transistors 321 and 325 and an output terminal of the differential amplifier 317 are also coupled.

A gate terminal of the second control transistor 312 may be coupled to the second input terminal 303. A source terminal of the second control transistor 312 may be coupled to the second current source 318. The drain terminal of the second control transistor 312 may be coupled to the gate terminal of the eighth transistor 327 and to a first end of the fourth resistance 316. The second end of the fourth resistance 316 may be coupled to the fourth node N4.

A first end of the first resistance 313 may be coupled to the drain terminal of the first transistor 320 and the source terminal of the second transistor 321 at a first node N1. The second end of the first resistance 313 may be coupled to a second end of the second resistance 314 and to a first input terminal of the differential amplifier 317 at a third node N3. The first end of the second resistance 314 may be coupled to the drain terminal of the sixth transistor 325 and the source terminal of the seventh transistor 326 at a second node N2. A second input terminal of the differential amplifier 317 may be coupled to the control voltage terminal 306.

In general, the differential amplifier 317 is configured to operate to maintain the voltage at the third node N3 equal or approximately equal to a control voltage on the control voltage terminal 306 in an analogous manner as the differential amplifier 217 of FIG. 2B is configured to operate to maintain the voltage at the third node N3 equal or approximately equal to a control voltage on the control voltage terminal 206.

The control circuit 310 may be configured to control the gate voltages of the third and eighth transistors 322 and 327 to control whether the third and eighth transistors 322 and 327 conduct or do not conduct using the first and second control transistors 311 and 312. For example, with the voltage at the fourth node N4 relatively stable, the gate voltage of the third transistor 322 may be controlled using the first control transistor 311. When the first control transistor 311 conducts, a current may pass through the third resistance 315. The current passing through the third resistance 315 may result in a voltage drop across the third resistance 315. As a result, the gate voltage of the third transistor 322 is the voltage on the fourth node N4 plus the voltage drop across the third resistance 315. The current through the third resistance 315 may be controlled by the second current source 318. Thus, by selecting appropriate values for the current of the second current source 318 and the third resistance 315, when the first control transistor 311 conducts, the voltage drop across the third resistance 315 may be sufficient such that the gate voltage of the third transistor 322 is such that the third transistor 322 does not conduct. In the alternative, when the first control transistor 311 does not conduct, there may not be a voltage drop across the third resistance 315 and the gate voltage of the third transistor 322 may be the voltage on the fourth node N4. The voltage on the fourth node N4 may be sufficient to cause the third transistor 322 to conduct. The control circuit 310 may be configured to control the gate voltage of the eighth transistor 327 using the second control transistor 312 and the fourth resistance 316 in a similar manner as discussed above with respect to the third transistor 322.

Modifications, additions, or omissions may be made to the circuit 300 without departing from the scope of the present disclosure. For example, additional active or passive circuit elements may be included in the circuit 300. Alternately or additionally, the circuit 300 may include a duty cycle sense circuit that may operate in a similar manner as the duty cycle sense circuit 230 of FIGS. 2A and 2B.

In FIGS. 1A, 2A, 2B, 3A, and 3B, the illustrated transistors are illustrated as metal-oxide-semiconductor field-effect transistor (MOSFET) transistors. The above description uses the nomenclature gate, source, and drain to represent different terminals of the transistors. The use of the names gate, source, and drain may be used to describe generically the terminals of a MOSFET transistor, or other types of transistors, such as bipolar junction transistors (BJT), junction gate field-effect transistors (JFET), and insulated gate bipolar transistors. Furthermore, p-channel transistors or some combination of re-channel and p-channel transistors may also be used.

Figure 4:
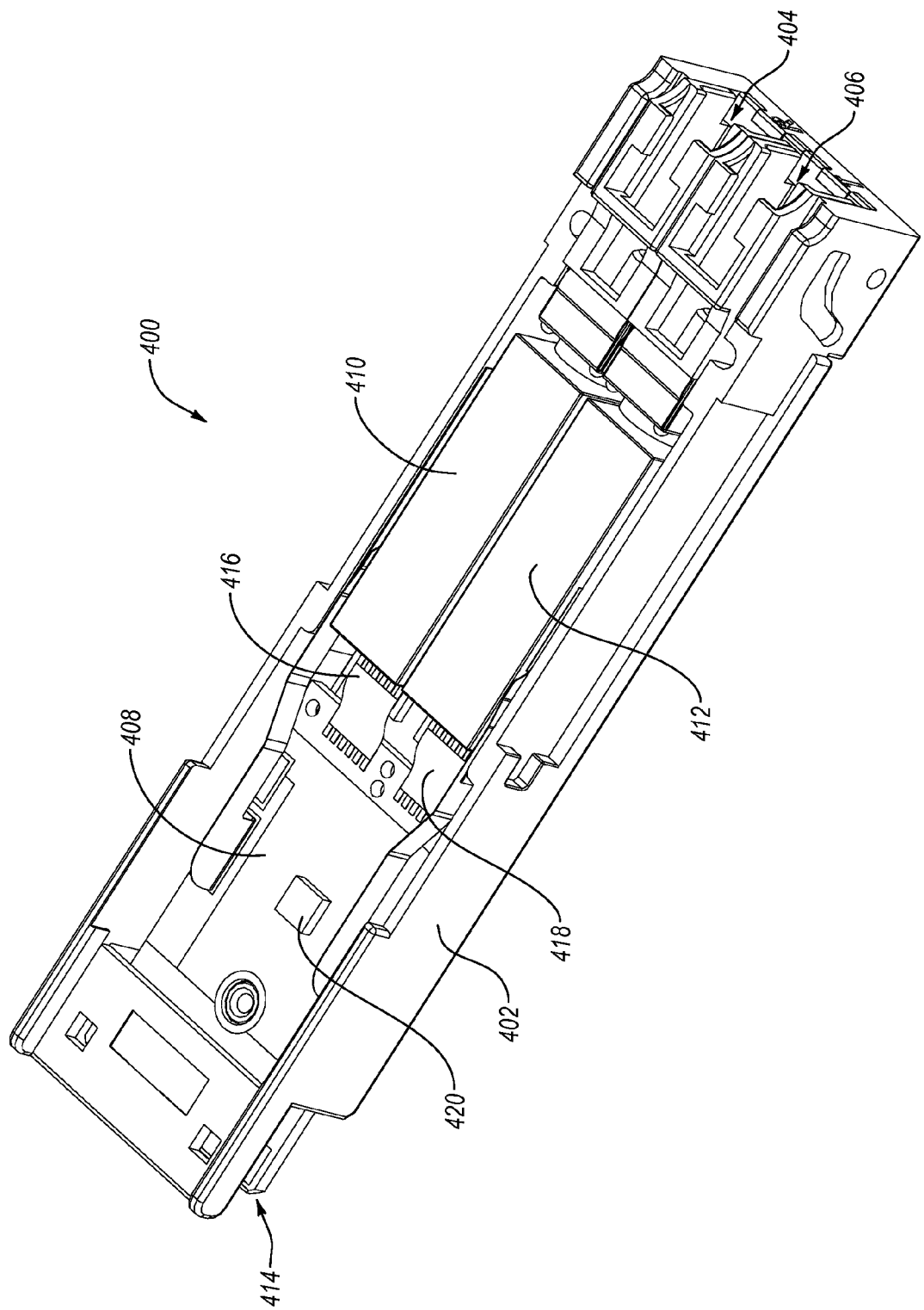
FIG. 4 is a perspective view of an example optoelectronic module where a signal may be converted.

FIG. 4 is a perspective view of an example optoelectronic module 400 (hereinafter "module 400") that may include a signal conversion circuit 420, arranged in accordance with at least some embodiments described herein. The module 400 may be configured for use in transmitting and receiving optical signals in connection with a host device (not shown).

As illustrated, the module 400 may include, but is not limited to, a bottom housing 402, a receive port 404, and a transmit port 406, both defined in the bottom housing 402; a PCB 408 positioned within the bottom housing 402, the PCB 408 having the signal conversion circuit 420 positioned thereon; and a receiver optical subassembly (ROSA) 410 and a transmitter optical subassembly (TOSA) 412 also positioned within the bottom housing 402. An edge connector 414 may be located on an end of the PCB 408 to enable the module 400 to electrically interface with the host device. As such, the PCB 408 facilitates electrical communication between the host device and the ROSA 410 and the TOSA 412.

The module 400 may be configured for optical signal transmission and reception at a variety of data rates including, but not limited to, 1 Gb/s, 10 Gb/s, 20 Gb/s, 40 Gb/s, 100 Gb/s, or higher. Furthermore, the module 400 may be configured for optical signal transmission and reception at various distinct wavelengths using wavelength division multiplexing (WDM) using one of various WDM schemes, such as Coarse WDM, Dense WDM, or Light WDM.

Furthermore, the module 400 may be configured to support various communication protocols including, but not limited to, Fibre Channel and High Speed Ethernet. In addition, although illustrated in a particular form factor in FIG. 4, more generally, the module 400 may be configured in any of a variety of different form factors including, but not limited to, the Small Form-factor Pluggable (SFP), the enhanced Small Form-factor Pluggable (SFP+), the 10 Gigabit Small Form-factor Pluggable (XFP), the C Form-factor Pluggable (CFP), and the Quad Small Form-factor Pluggable (QSFP) multi-source agreements (MSAs).

The ROSA 410 may house one or more optical receivers, such as photodiodes, that are electrically coupled to an electrical interface 416. The one or more optical receivers may be configured to convert optical signals received through the receive port 404 into corresponding electrical signals that are relayed to the host device through the electrical interface 416 and the PCB 408. The TOSA 412 may house one or more optical transmitters, such as lasers, that are electrically coupled to another electrical interface 418. The one or more optical transmitters may be configured to convert electrical signals received from the host device by way of the PCB 408 and the electrical interface 418 into corresponding optical signals that are transmitted through the transmit port 406. In some embodiments, the TOSA 412 may receive signals at a first voltage swing and may convert the signals to have a second voltage swing using a signal conversion circuit, such as one of the signal conversion circuits 100, 200, or 300 of FIGS. 1A, 2A, 2B, 3A, and 3B. For example, the TOSA 412 may receive a CML signal and may convert the CML signal to a CMOS signal that may be used to control a mach-zehnder modulator or some other component in the TOSA 412.

The module 400 illustrated with respect to FIG. 4 is one architecture in which embodiments of the present disclosure may be employed. It should be understood that this specific architecture is only one of countless architectures in which embodiments may be employed. The scope of the present disclosure is not intended to be limited to any particular architecture or environment.

In some embodiments, a circuit may include an output terminal; an input terminal configured to receive an input signal with a first voltage swing; and a first transistor including a first gate terminal, a first source terminal, and a first drain terminal.

The circuit may also include a second transistor including a second gate terminal, a second source terminal, and a second drain terminal, the second drain terminal coupled to the output terminal and the second source terminal coupled to a first voltage; a third transistor including a third gate terminal, a third source terminal, and a third drain terminal, the third drain terminal coupled to the output terminal, the third source terminal coupled to a second voltage, and the third gate terminal coupled to the first drain terminal; and a control circuit coupled to the input terminal, the first gate terminal, and the second gate terminal, the control circuit configured to adjust voltages provided to the first gate terminal and the second gate terminal based on the input signal such that the second transistor conducts in response to the input signal being at a first logical level and the third transistor conducts in response to the input signal being at a second logical level to generate an output signal output on the output terminal, wherein a second voltage swing of the output signal is different from the first voltage swing of the input signal.

In one or more of the above embodiments, a middle voltage of the first voltage swing is offset from a middle voltage of the second voltage swing.

In one or more of the above embodiments, the second voltage swing is between the first voltage and the second voltage and the second voltage is at ground potential.

In one or more of the above embodiments, the circuit further includes a duty cycle sense circuit coupled to the output terminal, the duty cycle sense circuit configured to detect a duty cycle of the output signal and to provide an indication of the detected duty cycle to the control circuit.

In one or more of the above embodiments, the control circuit is further configured to adjust the voltages provided to the first gate terminal, the first source terminal, and the second gate terminal based on the input signal and the indication of the detected duty cycle to generate the output signal with an adjusted duty cycle.

In one or more of the above embodiments, the circuit further includes a control terminal configured to receive a control signal, wherein the control terminal is coupled to the control circuit and the control circuit is configured to adjust a duty cycle of the output signal based on the control signal.

In one or more of the above embodiments, the control signal is a voltage signal.

In one or more of the above embodiments, the input signal is a first signal of a current-mode-logic differential signal and the output signal is a first signal of a complementary metal-oxide semiconductor differential signal.

In one or more of the above embodiments, the circuit further includes a first intermediate transistor including a first intermediate gate terminal, a first intermediate source terminal, and a first intermediate drain terminal, the first intermediate drain terminal coupled to the first drain terminal, the first intermediate gate terminal, and the third gate terminal and the first intermediate source terminal coupled to the second voltage; and a second intermediate transistor including a second intermediate gate terminal, a second intermediate source terminal, and a second intermediate drain terminal, the second intermediate drain terminal coupled to the first source terminal and the second intermediate gate terminal coupled to the input terminal.

In one or more of the above embodiments, the circuit further includes a second output terminal; a second input terminal configured to receive a second input signal with a first voltage swing, wherein the input signal and the second input signal form an input differential signal; a fourth transistor including a fourth gate terminal, a fourth source terminal, and a fourth drain terminal; a fifth transistor including a fifth gate terminal, a fifth source terminal, and a fifth drain terminal, the fifth drain terminal coupled to the second output terminal and the fifth source terminal coupled to the first voltage; and a sixth transistor including a sixth gate terminal, a sixth source terminal, and a sixth drain terminal, the sixth drain terminal coupled to the second output terminal, the sixth source terminal coupled to the second voltage, and the sixth gate terminal coupled to the fourth drain terminal, wherein the control circuit is further coupled to the second input terminal, the fourth gate terminal, and the fifth gate terminal, the control circuit configured to adjust voltages provided to the fourth gate terminal and the fifth gate terminal based on the second input signal such that the fourth transistor conducts in response to the second input signal being at the first logical level and the fifth transistor conducts in response to the second input signal being at the second logical level to generate a second output signal output on the second output terminal, wherein the output signal and the second output signal form an output differential signal.

In some embodiments, a circuit may include an input terminal configured to receive an input signal with a first voltage swing; an output terminal configured to output an output signal with a second voltage swing that is different than the first voltage swing; a first transistor that includes a first gate terminal and a first drain terminal, the first gate terminal coupled to the input terminal; a second transistor that includes a second gate terminal, a second source terminal, and a second drain terminal, the second source terminal coupled to the first drain terminal; an amplifier that includes first and second amplifier input terminals and an amplifier output terminal, the amplifier output terminal coupled to the second gate terminal and the first amplifier input terminal configured to receive a control voltage; a first resistance between the second source terminal and the second amplifier input terminal; a third transistor including a third gate terminal, a third source terminal, and a third drain terminal, the third source terminal coupled to a first voltage, the third drain terminal coupled to the output terminal; a second resistance coupled between the third gate terminal and the amplifier output terminal; and a fourth transistor including a fourth gate terminal, a fourth source terminal, and a fourth drain terminal, the fourth source terminal coupled to a second voltage, the fourth drain terminal coupled to the output terminal, and the fourth gate terminal coupled to the second drain terminal.

In one or more of the above embodiments, the control voltage is approximately equal to the second voltage.

In one or more of the above embodiments, the amplifier is configured to control a gate voltage at the second gate terminal of the second transistor to maintain an amplifier input voltage approximately equal to the control voltage.

In one or more of the above embodiments, the first voltage is approximately ground potential and the second voltage swing of the output signal is between the first voltage and the second voltage, wherein the second voltage swing is larger than the first voltage swing.

In one or more of the above embodiments, the fourth transistor is a n-type metal-oxide-semiconductor field-effect transistor and the first, second, and third transistors are p-type metal-oxide-semiconductor field-effect transistors.

In one or more of the above embodiments, the second voltage swing of the output signal is between the first voltage and the second voltage and a middle point of the second voltage swing is higher than a middle point of the first voltage swing.

In one or more of the above embodiments, the fourth transistor is a p-type metal-oxide-semiconductor field-effect transistor and the first, second, and third transistors are n-type metal-oxide-semiconductor field-effect transistors.

In one or more of the above embodiments, the circuit further includes a fifth transistor that includes a fifth gate terminal, a fifth source terminal, and a fifth drain terminal, the fifth drain terminal coupled to the second drain terminal, the fifth gate terminal, and the fourth gate terminal and the fifth source terminal coupled to the second voltage; and a sixth transistor that includes a sixth gate terminal, a sixth source terminal, and a sixth drain terminal, the sixth drain terminal coupled to the third gate terminal, the sixth gate terminal coupled to the input terminal, and the sixth source terminal coupled to a current source.

In one or more of the above embodiments, the circuit further includes a second input terminal configured to receive a second input signal with the first voltage swing, wherein the input signal and the second input signal form an output differential signal; a second output terminal configured to output a second output signal with the second voltage swing, wherein the output signal and the second output signal form an output differential signal; a fifth transistor that includes a fifth gate terminal and a fifth drain terminal, the fifth gate terminal coupled to the second input terminal; a sixth transistor that includes a sixth gate terminal, a sixth source terminal, and a sixth drain terminal, the sixth source terminal coupled to the fifth drain terminal; a third resistance between the sixth source terminal and the second amplifier input terminal; a seventh transistor that includes a seventh gate terminal, a seventh source terminal, and a seventh drain terminal, the seventh source terminal coupled to the first voltage and the seventh drain terminal coupled to the second output terminal; a fourth resistance coupled between the seventh gate terminal and the amplifier output terminal; and an eighth transistor that includes an eighth gate terminal, an eighth source terminal, and an eighth drain terminal, the eighth source terminal coupled to the second voltage, the eighth drain terminal coupled to the second output terminal; and the eighth gate terminal coupled to the sixth drain terminal.

In one or more of the above embodiments, the input signal is a first signal of a current-mode-logic differential signal and the output signal is a first signal of a complementary metal-oxide semiconductor differential signal.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description of embodiments, claims, or drawings, should be understood to contemplate the possibilities of including one of the terms, either of the terms, or both terms. For example, the phrase "A or B" should be understood to include the possibilities of "A" or "B" or "A and B."

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit, comprising:
an output terminal;
an input terminal configured to receive an input signal with a first voltage swing;
a first transistor including a first gate terminal, a first source terminal, and a first drain terminal;
a second transistor including a second gate terminal, a second source terminal, and a second drain terminal, the second drain terminal coupled to the output terminal and the second source terminal coupled to a first voltage;
a third transistor including a third gate terminal, a third source terminal, and a third drain terminal, the third drain terminal coupled to the output terminal, the third source terminal coupled to a second voltage, and the third gate terminal coupled to the first drain terminal; and
a control circuit coupled to the input terminal, the first gate terminal, and the second gate terminal, the control circuit configured to adjust voltages provided to the first gate terminal and the second gate terminal based on the input signal such that the second transistor conducts in response to the input signal being at a first logical level and the third transistor conducts in response to the input signal being at a second logical level to generate an output signal output on the output terminal, wherein a second voltage swing of the output signal is different from the first voltage swing of the input signal, the output signal is a first signal of a complementary metal-oxide semiconductor differential signal, and the input signal is a first signal of a current-mode-logic differential signal.

2. The circuit of claim 1, wherein a middle voltage of the first voltage swing is offset from a middle voltage of the second voltage swing.

3. The circuit of claim 2, wherein the second voltage swing is between the first voltage and the second voltage and the second voltage is at ground potential.

4. The circuit of claim 1, further comprising a duty cycle sense circuit coupled to the output terminal, the duty cycle sense circuit configured to detect a duty cycle of the output signal and to provide an indication of the detected duty cycle to the control circuit.

5. The circuit of claim 4, wherein the control circuit is further configured to adjust the voltages provided to the first gate terminal, the first source terminal, and the second gate terminal based on the input signal and the indication of the detected duty cycle to generate the output signal with an adjusted duty cycle.

6. The circuit of claim 1, further comprising a control terminal configured to receive a control signal, wherein the control terminal is coupled to the control circuit and the control circuit is configured to adjust a duty cycle of the output signal based on the control signal.

7. The circuit of claim 1, further comprising:
a first intermediate transistor including a first intermediate gate terminal, a first intermediate source terminal, and a first intermediate drain terminal, the first intermediate drain terminal coupled to the first drain terminal, the first intermediate gate terminal, and the third gate terminal and the first intermediate source terminal coupled to the second voltage; and
a second intermediate transistor including a second intermediate gate terminal, a second intermediate source terminal, and a second intermediate drain terminal, the second intermediate drain terminal coupled to the first source terminal and the second intermediate gate terminal coupled to the input terminal.

8. The circuit of claim 1, further comprising:
a second output terminal;
a second input terminal configured to receive a second input signal with a first voltage swing, wherein the input signal and the second input signal form an input differential signal;
a fourth transistor including a fourth gate terminal, a fourth source terminal, and a fourth drain terminal;
a fifth transistor including a fifth gate terminal, a fifth source terminal, and a fifth drain terminal, the fifth drain terminal coupled to the second output terminal and the fifth source terminal coupled to the first voltage; and
a sixth transistor including a sixth gate terminal, a sixth source terminal, and a sixth drain terminal, the sixth drain terminal coupled to the second output terminal, the sixth source terminal coupled to the second voltage, and the sixth gate terminal coupled to the fourth drain terminal,
wherein the control circuit is further coupled to the second input terminal, the fourth gate terminal, and the fifth gate terminal, the control circuit configured to adjust voltages provided to the fourth gate terminal and the fifth gate terminal based on the second input signal such that the fourth transistor conducts in response to the second input signal being at the first logical level and the fifth transistor conducts in response to the second input signal being at the second logical level to generate a second output signal output on the second output terminal, wherein the output signal and the second output signal form an output differential signal.

9. A circuit comprising:
an input terminal configured to receive an input signal with a first voltage swing;
an output terminal configured to output an output signal with a second voltage swing that is different than the first voltage swing;
a first transistor that includes a first gate terminal and a first drain terminal, the first gate terminal coupled to the input terminal;
a second transistor that includes a second gate terminal, a second source terminal, and a second drain terminal, the second source terminal coupled to the first drain terminal;
an amplifier that includes first and second amplifier input terminals and an amplifier output terminal, the amplifier output terminal coupled to the second gate terminal and the first amplifier input terminal configured to receive a control voltage;
a first resistance between the second source terminal and the second amplifier input terminal;
a third transistor including a third gate terminal, a third source terminal, and a third drain terminal, the third source terminal coupled to a first voltage, the third drain terminal coupled to the output terminal;
a second resistance coupled between the third gate terminal and the amplifier output terminal; and
a fourth transistor including a fourth gate terminal, a fourth source terminal, and a fourth drain terminal, the fourth source terminal coupled to a second voltage, the fourth drain terminal coupled to the output terminal, and the fourth gate terminal coupled to the second drain terminal.

10. The circuit of claim 9, wherein the control voltage is approximately equal to the second voltage.

11. The circuit of claim 9, wherein the amplifier is configured to control a gate voltage at the second gate terminal of the second transistor to maintain an amplifier input voltage approximately equal to the control voltage.

12. The circuit of claim 9, wherein the first voltage is approximately ground potential and the second voltage swing of the output signal is between the first voltage and the second voltage, wherein the second voltage swing is larger than the first voltage swing.

13. The circuit of claim 12, wherein the fourth transistor is a n-type metal-oxide-semiconductor field-effect transistor and the first, second, and third transistors are p-type metal-oxide-semiconductor field-effect transistors.

14. The circuit of claim 9, wherein the second voltage swing of the output signal is between the first voltage and the second voltage and a middle point of the second voltage swing is higher than a middle point of the first voltage swing.

15. The circuit of claim 14, wherein the fourth transistor is a p-type metal-oxide-semiconductor field-effect transistor and the first, second, and third transistors are n-type metal-oxide-semiconductor field-effect transistors.

16. The circuit of claim 9, further comprising:
a fifth transistor that includes a fifth gate terminal, a fifth source terminal, and a fifth drain terminal, the fifth drain terminal coupled to the second drain terminal, the fifth gate terminal, and the fourth gate terminal and the fifth source terminal coupled to the second voltage; and
a sixth transistor that includes a sixth gate terminal, a sixth source terminal, and a sixth drain terminal, the sixth drain terminal coupled to the third gate terminal, the sixth gate terminal coupled to the input terminal, and the sixth source terminal coupled to a current source.

17. The circuit of claim 9, further comprising:
a second input terminal configured to receive a second input signal with the first voltage swing, wherein the input signal and the second input signal form an output differential signal;
a second output terminal configured to output a second output signal with the second voltage swing, wherein the output signal and the second output signal form an output differential signal;
a fifth transistor that includes a fifth gate terminal and a fifth drain terminal, the fifth gate terminal coupled to the second input terminal;
a sixth transistor that includes a sixth gate terminal, a sixth source terminal, and a sixth drain terminal, the sixth source terminal coupled to the fifth drain terminal;
a third resistance between the sixth source terminal and the second amplifier input terminal;
a seventh transistor that includes a seventh gate terminal, a seventh source terminal, and a seventh drain terminal, the seventh source terminal coupled to the first voltage and the seventh drain terminal coupled to the second output terminal;

a fourth resistance coupled between the seventh gate terminal and the amplifier output terminal; and an eighth transistor that includes an eighth gate terminal, an eighth source terminal, and an eighth drain terminal, the eighth source terminal coupled to the second voltage, the eighth drain terminal coupled to the second output terminal; and the eighth gate terminal coupled to the sixth drain terminal.

18. The circuit of claim 9, wherein the input signal is a first signal of a current-mode-logic differential signal and the output signal is a first signal of a complementary metal-oxide semiconductor differential signal.

19. A circuit, comprising:

an output terminal;

an input terminal configured to receive an input signal with a first voltage swing;

a first transistor including a first gate terminal, a first source terminal, and a first drain terminal;

a second transistor including a second gate terminal, a second source terminal, and a second drain terminal, the second drain terminal coupled to the output terminal and the second source terminal coupled to a first voltage;

a third transistor including a third gate terminal, a third source terminal, and a third drain terminal, the third drain terminal coupled to the output terminal, the third source terminal coupled to a second voltage, and the third gate terminal coupled to the first drain terminal; and a control circuit coupled to the input terminal, the first gate terminal, and the second gate terminal, the control circuit configured to adjust voltages provided to the first gate terminal and the second gate terminal based on the input signal such that the second transistor conducts in response to the input signal being at a first logical level and the third transistor conducts in response to the input signal being at a second logical level to generate an output signal output on the output terminal, wherein a second voltage swing of the output signal is different from the first voltage swing of the input signal and a middle voltage of the first voltage swing is offset from a middle voltage of the second voltage swing.

20. The circuit of claim 19, wherein the input signal is a first signal of a current-mode-logic differential signal and the output signal is a first signal of a complementary metal-oxide semiconductor differential signal.

* * * * *